United States Patent
Kondo et al.

(10) Patent No.: US 11,262,046 B2
(45) Date of Patent: Mar. 1, 2022

(54) PHOSPHOR ELEMENT, METHOD FOR PRODUCING SAME, AND LIGHTING DEVICE

(71) Applicant: NGK INSULATORS, LTD., Aichi (JP)

(72) Inventors: Jungo Kondo, Aichi (JP); Naotake Okada, Aichi (JP); Yuichi Iwata, Aichi (JP); Keiichiro Asai, Aichi (JP); Yudai Uno, Aichi (JP)

(73) Assignee: NGK INSULATORS, LTD., Nagoya (JP)

( * ) Notice: Subject to any disclaimer, the term of this patent is extended or adjusted under 35 U.S.C. 154(b) by 0 days.

(21) Appl. No.: 17/213,917

(22) Filed: Mar. 26, 2021

(65) Prior Publication Data

US 2021/0215318 A1 Jul. 15, 2021

Related U.S. Application Data

(63) Continuation of application No. PCT/JP2019/013259, filed on Mar. 27, 2019.

(51) Int. Cl.
*F21V 9/30* (2018.01)
*C09K 11/02* (2006.01)
(Continued)

(52) U.S. Cl.
CPC ............... *F21V 9/30* (2018.02); *C09K 11/02* (2013.01); *C09K 11/7774* (2013.01); *H01S 5/0087* (2021.01); *H01S 5/3013* (2013.01)

(58) Field of Classification Search
CPC ..... F21V 9/30; F21V 9/32; F21V 7/26; C09K 11/7774; C09K 11/02; H01S 5/3013;
(Continued)

(56) References Cited

U.S. PATENT DOCUMENTS

| | | | | |
|---|---|---|---|---|
| 2010/0046234 A1* | 2/2010 | Abu-Ageel | .......... | G02B 3/0006 362/308 |
| 2010/0202129 A1* | 8/2010 | Abu-Ageel | ........ | G02B 19/0066 362/84 |

(Continued)

FOREIGN PATENT DOCUMENTS

| | | |
|---|---|---|
| JP | 5679435 B2 | 9/2012 |
| JP | 2013187043 A | 9/2013 |

(Continued)

OTHER PUBLICATIONS

English Translation of the International Preliminary Report on Patentability, issued in corresponding International Application No. PCT/JP2019/013259 dated Apr. 8, 2021 (11 pages).

(Continued)

*Primary Examiner* — Rajarshi Chakraborty
*Assistant Examiner* — Glenn D Zimmerman
(74) *Attorney, Agent, or Firm* — Flynn Thiel, P.C.

(57) ABSTRACT

A phosphor element includes: a phosphor part having an incident face for excitation light, an opposing face opposing the incident face, and a side face, the phosphor part converting at least a part of the excitation light incident onto the incident face into a fluorescence and emitting the fluorescence from the incident face; an integral low refractive index layer on the side face and opposing face of the phosphor part and having a refractive index lower than that of the phosphor part; and an integral reflection film covering a surface of the low refractive index layer. The area of the incident face of the phosphor part is larger than the area of the opposing face.

12 Claims, 14 Drawing Sheets

(51) Int. Cl.
*C09K 11/77* (2006.01)
*H01S 5/00* (2006.01)
*H01S 5/30* (2006.01)

(58) Field of Classification Search
CPC ............... H01S 5/0087; F21Y 2115/30; G02B 19/0028; G02B 19/0047; G02B 2207/113; H01L 33/60; H01L 33/505
See application file for complete search history.

(56) References Cited

U.S. PATENT DOCUMENTS

| | | | |
|---|---|---|---|
| 2010/0320480 A1* | 12/2010 | Rapoport | H01L 33/50 257/88 |
| 2014/0042467 A1* | 2/2014 | Livesay | H01L 33/642 257/88 |
| 2016/0061391 A1 | 3/2016 | Inoue et al. | |
| 2016/0077415 A1 | 3/2016 | Motoya et al. | |
| 2016/0315230 A1* | 10/2016 | Yoshimura | H01L 33/504 |
| 2016/0320003 A1* | 11/2016 | Yuan | C09K 11/7774 |
| 2017/0023199 A1 | 1/2017 | Hamada et al. | |
| 2017/0030556 A1 | 2/2017 | Shirakawa et al. | |
| 2017/0219171 A1 | 8/2017 | Sorg | |
| 2019/0120442 A1 | 4/2019 | Okada et al. | |

FOREIGN PATENT DOCUMENTS

| | | |
|---|---|---|
| JP | 201486556 A | 5/2014 |
| JP | 2014186916 A | 10/2014 |
| JP | 201550124 A | 3/2015 |
| JP | 201658624 A | 4/2016 |
| JP | 201728251 A | 2/2017 |
| JP | 201785038 A | 5/2017 |
| WO | 2014119783 A1 | 8/2014 |
| WO | 2015163109 A1 | 10/2015 |
| WO | 2017217486 A1 | 12/2017 |

OTHER PUBLICATIONS

International Search Report with English Translation issued in corresponding International Application No. PCT/JP2019/013259 dated Jun. 4, 2019 (5 pages).

Written Opinion of International Searching Authority issued in corresponding International Application No. PCT/JP2019/013259 dated Jun. 4, 2019 (7 pages).

* cited by examiner

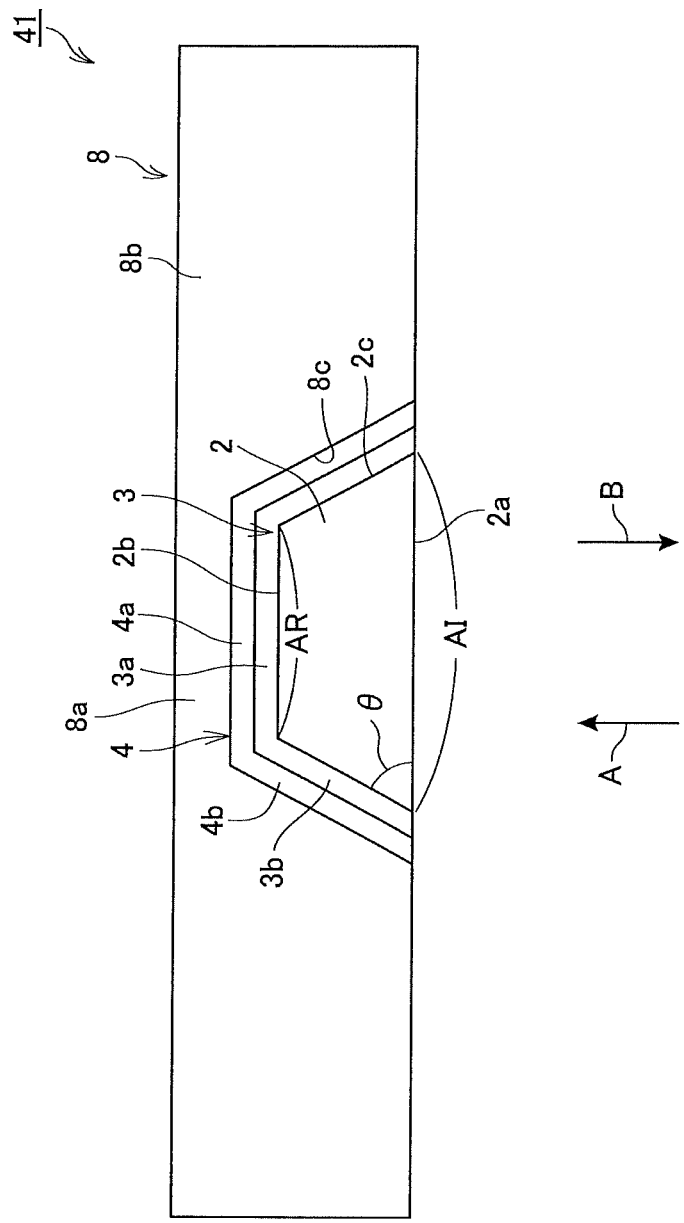

PHOSPHOR ELEMENT, METHOD FOR PRODUCING SAME, AND LIGHTING DEVICE

CROSS-REFERENCE TO RELATED APPLICATIONS

This is a continuation of PCT/JP2019/013259, filed Mar. 27, 2019, which claims priority to PCT Application No. PCT/JP2018/036331, filed Sep. 28, 2018, the entire contents of which are hereby incorporated by reference.

TECHNICAL FIELD

The present invention relates to a phosphor element, a method of producing the same and an illumination device emitting a fluorescence.

BACKGROUND ARTS

Recently, intensive studies have been undertaken in headlights for a vehicle employing a laser light source, and one thereof is a white light source constructed by combining a blue laser or ultraviolet laser and a phosphor. The optical density of the excitation light can be increased by condensing the laser light and, moreover, the light intensity of the excitation light can also be increased by condensing multiple beams of laser light so as to overlap on the phosphor. As a result, light flux and brightness can simultaneously be increased without changing a light emission area. Therefore, a white light source that combines a semiconductor laser and a phosphor with each other is attracting attention as a light source that replaces the LED. For example, as the phosphor glass used for the vehicle headlight, a phosphor glass "Lumiphous TM" from Nippon Electric Glass and YAG monocrystal fluorescent bodies from National Institute for Materials Science, Tamura Corporation, and Koha Co., Ltd. are proposed.

According to a phosphor element described in patent document 1 (U.S. Pat. No. 5,679,435B), the width of the phosphor is made larger from an incident face to an emitting face. It is described that the inclination angle of the side face of the phosphor is made 15° or more and 35° or lower. Then, the phosphor is contained in a resin case and a metal film is formed so that the inner surface of the case functions as a reflector part. The phosphor is fixed on the bottom face of the case with a sealing resin and the side face of the phosphor is covered with air.

According to a phosphor element described in patent document 2 (JP 2017-085038A), the width of the phosphor is increased from an incident face to an emitting face, the phosphor is contained in a through hole of a heat dissipation member, and a side face of the through hole is bonded with the surface of the through hole with a glass paste.

Further, according to the phosphor elements described in patent documents 3 to 7, an excitation light is made incident onto the phosphor element and the fluorescence and excitation light are reflected in a phosphor to change their directions and then emitted from the phosphor as white light.

PATENT DOCUMENTS (Patent document 1) Japanese Patent No. 5679435B
(Patent document 2) Japanese Patent Publication No. 2017-085038A
(Patent document 3) Japanese Patent Publication No. 2013-187043A
(Patent document 4) Japanese Patent Publication No. 2014-086556A
(Patent document 5) WO 2017/217486 A1
(Patent document 6) Japanese Patent Publication No. 2015-050124A
(Patent document 7) Japanese Patent Publication No. 2016-058624A

SUMMARY OF THE INVENTION

According to the phosphor elements of patent documents 1 and 2, an excitation light is made incident onto an incident face of a phosphor and the excitation light and fluorescence are emitted from an emitting face on the opposite side of the incident face. It is thereby impossible to change the light route, limiting the possible design.

On the other hand, as the inventors have researched a reflection type phosphor element which reflects light in the phosphor, the following problems were found. That is, for improving the intensity of the fluorescence, it is necessary to raise the intensity of the excitation light. However, according to the reflection type phosphor element, as the excitation light and fluorescence are reflected and propagated in the phosphor, the number of reflections is high, resulting in the disappearance of photons due to absorption and scattering by the reflection. Thus, as the intensity of the excitation light is raised, the temperature of the phosphor is raised, limiting the thus obtained optical intensity. Further, a color unevenness may be generated in the white light emitted from the element. It is thus necessary to maintain the fluorescence intensity in the emitted light during continued use and to suppress the color unevenness.

An object of the present invention is, in generating a fluorescence by making an excitation light incident onto a reflection-type phosphor element, to improve the intensity of the fluorescence in the emitted light and to suppress the color unevenness of the emitted white light.

Further, an object of the present invention is, in producing a reflection type-phosphor element, to provide a production method for facilitating the heat dissipation from a phosphor part.

The present invention provides a phosphor element comprising:

a phosphor part including an incident face of an excitation light, an opposing face opposing the incident face, and a side face, the phosphor part converting at least apart of the excitation light incident onto the incident face to a fluorescence and emitting the fluorescence from the incident face, an integral low refractive index layer on the side face and said opposing face of the phosphor part, the low refractive index part having a refractive index lower than a refractive index of the phosphor part; and an integral reflection film covering a surface of the low refractive index layer, wherein the area of the incident face of the phosphor part is larger than the area of the opposing face.

Further, the present invention provides an illumination device comprising:

a light source oscillating a laser light; and
the phosphor element.

Further, the present invention provides a method of producing a phosphor element comprising:

a phosphor part comprising an incident face of an excitation light, an opposing face opposing the incident face and a side face, the phosphor part converting at least apart of the excitation light incident onto the incident face into a fluorescence and emitting the fluorescence from the incident face, and an integral reflection film covering the phosphor part, wherein the area of the incident face of the phosphor part is larger than the area of the opposing face, the method comprising the steps of:

bonding a phosphor substrate having a first main face and a second main face to a handle substrate at the second main face;

processing the first main face of the phosphor substrate to form the opposing face and the side face so that the phosphor part is formed;

film-forming the reflection film to cover the opposing face and, the side face; and separating the phosphor part from the handle substrate.

According to the present invention, in a phosphor element in which an excitation light is incident onto an incident face of a phosphor part and emits the excitation light and fluorescence from the incident face, the fluorescence intensity in the emitted light can be maintained high and the color unevenness can be suppressed.

Further, according to the production method of the present invention, in the phosphor element in which an excitation light is incident onto the incident face of the phosphor part and emits the excitation light and fluorescence from the incident face, it is possible to form an integral reflection film with the same material and without a break on the side face and opposing face of the phosphor part at the same time, so that the heat dissipation from the reflection film can be facilitated.

Further, according to patent document 6, a total reflection film and reflection film are formed on a main face of a flat plate-shaped phosphor layer and the thickness of the phosphor layer is constant. Further, according to patent document 7, a reflection film is provided on a side face of a ceramic phosphor and the side face of a phosphor layer is tapered. However, the reflection part is plate-shaped and not of a laminated structure with a low refractive index layer. Thus, if patent documents 6 and 7 would have been combined with each other, the side face of the phosphor layer would be tapered, the reflection film would be provided on the side face, and the low refractive index layer and reflection film would be provided on the main face of the phosphor layer. However, such structure would be shown in FIG. 4, which is described later and would not provide the effects of the present invention.

BRIEF DESCRIPTION OF THE DRAWINGS

FIG. 7 is a cross-sectional view of the phosphor element 41.

EMBODIMENT FOR CARRYING OUT THE INVENTION

Figure 1A:
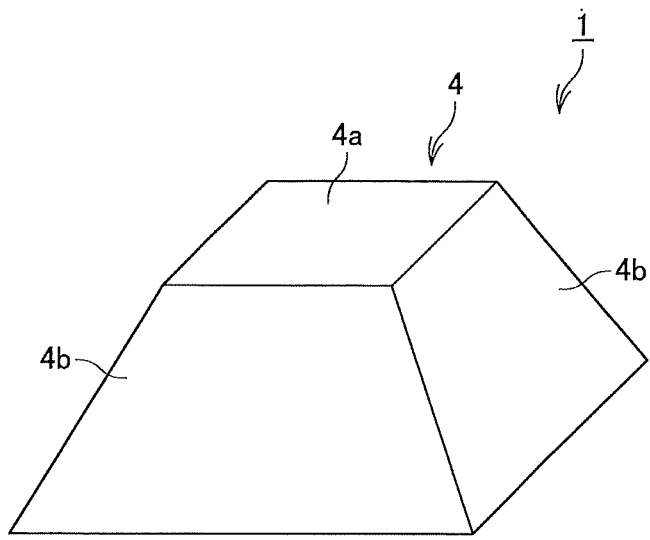
FIG. 1(*a*) is a perspective view showing a phosphor element 1 according to an embodiment of the present invention and FIG. 1(*b*) is a cross-sectional view of the phosphor element 1.

The present invention will be described further in detail below, appropriately referring to the drawings.

Figure 1B:
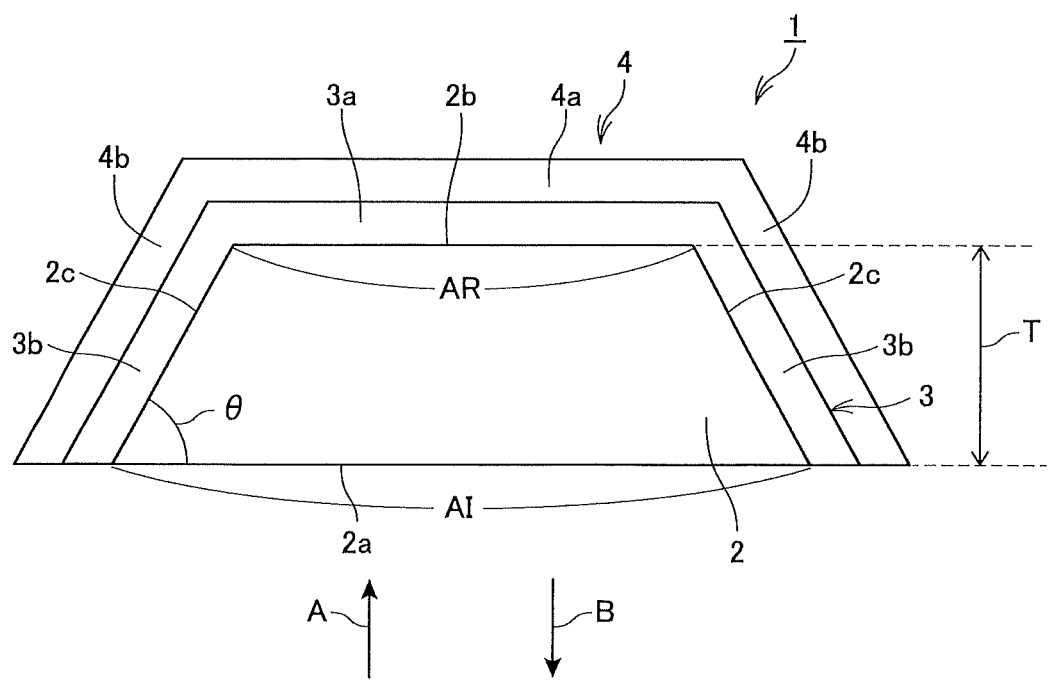
Figure 2A:
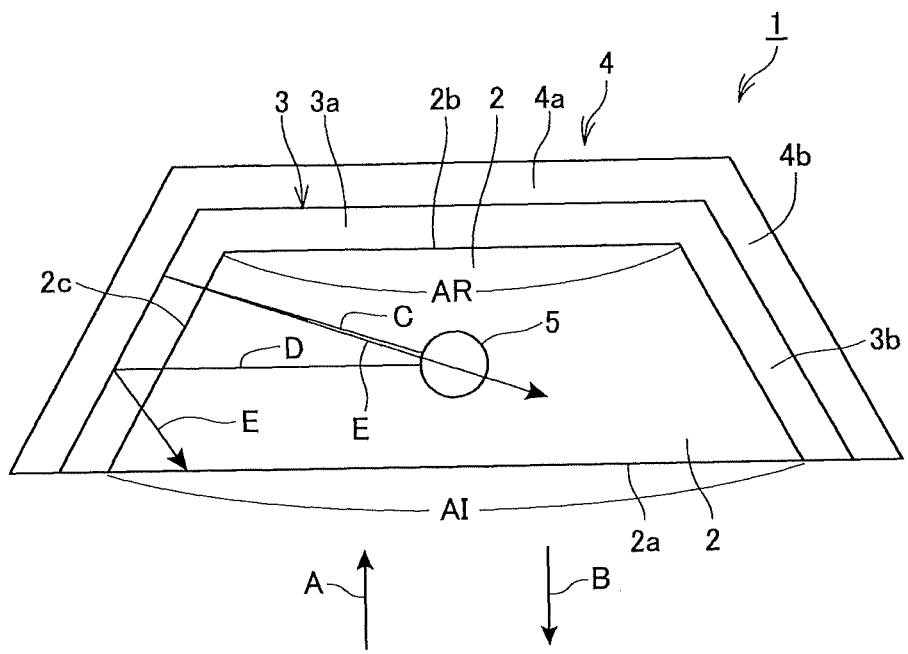
FIG. 2(*a*) is a schematic view showing the propagation route of light in the phosphor element 1 and FIG. 2(*b*) is a schematic view showing the propagation route of light in a phosphor element 11 according to a comparative example.

According to a phosphor element 1 shown in FIG. 1, a phosphor part 2 includes an incident face 2*a*, emitting face 2*b* and four side faces 2*c*. As shown in FIG. 2(*b*), at a cross section of the phosphor part, the phosphor part has a shape substantially of a trapezoid, and an angle θ of the side face 2*c* with respect to the incident face 2*a* is an acute angle less than 90°. Then, the area AI of the incident face 2*a* is larger than the area AR of the opposing face 2*b*.

A low refractive index layer 3*b* is provided on the side face 2*c* of the phosphor part 2, a low refractive index layer 3*a* is provided on the opposing face 2*b*, and the low refractive index layers 3*a* and 3*b* together form an integral low refractive index layer 3. According to the present example, the whole of the side faces 2*c* and opposing face 2*b* of the phosphor part 2 is covered with the single material of the low refractive index layer 3. Further, according to the present example, a reflection film 4*a* is provided on the low refractive index layer 3*a*, a reflection film 4*b* is provided on the low refractive index layer 3*b*, and the refraction films 4*a* and 4*b* forms an integral refraction film 4 with the same material. According to the present example, the whole of the low refractive index layer 3 is covered with the reflection film 4.

Here, it will be described further the reason why a high florescence intensity is obtained and color unevenness is suppressed according to the inventive phosphor element.

As shown in FIG. 2(*a*), according to the phosphor element 1 of the present invention, the excitation light incident as an arrow A is irradiated onto many phosphor particles dispersed in the phosphor part 2. Then, a fluorescence is emitted from the respective phosphor particles 5 as arrows C and D. At this time, there is the tendency that the fluorescence is emitted uniformly and in any direction from the respective phosphor particles.

Here, the fluorescence radiated from the phosphor particles toward the incident face 2a is emitted from the incident face 2a as such. Further, the fluorescence radiated from the phosphor particles toward the opposing face 2b is reflected at the opposing face and then emitted from the incident face 2a as such. However, the fluorescence radiated diagonally as arrows C and D is reflected at the reflection film 4b and emitted from the incident face 2a as arrows E and B. At this time, as the area AI of the incident face of the phosphor part 2 is larger than the area AR of the opposing face and the side face 2c is inclined, the direction of the reflected light E is inclined toward the inclined face 2a by the inclination angle θ. As a result, it is possible to reduce the number of reflections until the fluorescence is emitted from the incident face 2a.

Figure 2B:
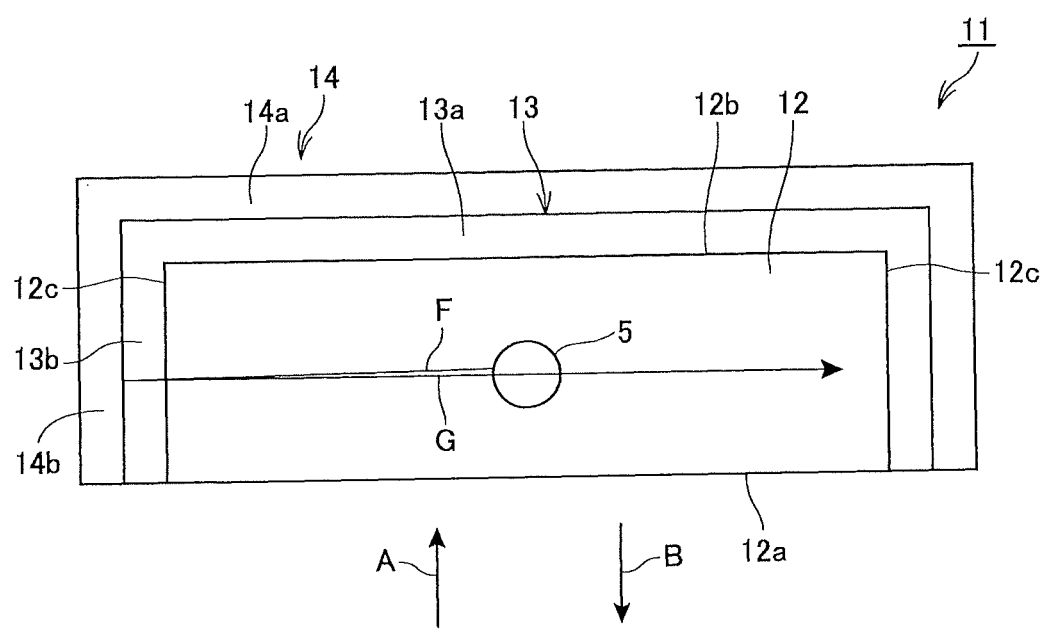

On the other hand, according to a phosphor element 11 shown in FIG. 2(b), the width of a phosphor part 12 is constant. Then, low refractive index layers 13a and 13b are provided on side faces 12c and an opposing face 12b of a phosphor element 12, and the low refractive index layers 13a and 13b are composed of the same material to form an integral low refractive index layer 13. A reflection layer 14b is provided on the low refractive index layer 13b, the reflective index layer 14a is provided on the low refractive index layer 13a, and the reflection films 14a and 14b are composed of the same material to form an integral reflection film 14.

In this case, the fluorescence F radiated from the phosphor particles 5 toward the side faces 12c, for example, is reflected and returned to the particles 5 as arrows G as such, so that it is not to be reflected at the incident face 12a. That is, as the side faces 12c and incident face 12a intersect at the right angle with each other, the effect of directing the fluorescence toward the incident face 12a is not obtained when the fluorescence is reflected. As a result, the number of reflections of the fluorescence is increased. As the reflectivity at the reflection film is not 100 percent and a part of the fluorescence is absorbed by the reflection film, the fluorescence is damped as the number of reflections is increased, resulting in an increase of the temperature of the reflection film and a deterioration of heat dissipation through the phosphor part. The temperature of the phosphor is thus raised and the intensity of the fluorescence is decreased.

Figure 3A:
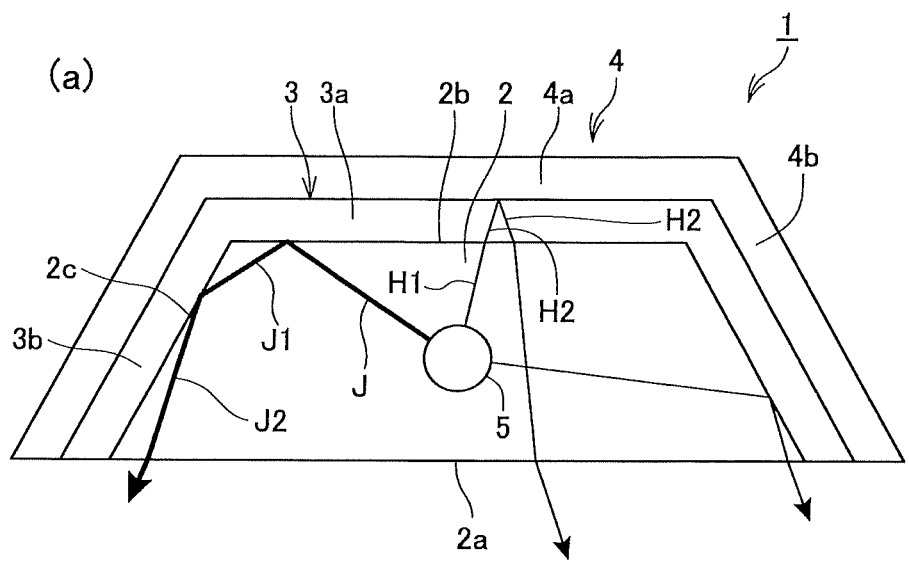
FIG. 3(*a*) is a schematic view showing the propagation route of light in the phosphor element 1 and FIG. 3(*b*) is a schematic view showing the propagation route of light in a phosphor element 21 according to a comparative example.

Further, as shown in FIG. 3(a), according to the phosphor element of the present invention, among the fluorescence oscillated from the phosphor particles 5, fluorescence H1 is not subjected to total reflection at the low refractive index layer, is refracted at an interface between the phosphor part 2 and low refractive index layer 3a, reflected at the reflection layer 4a as H2, refracted at the interface between the phosphor part 2 and low refractive index layer 3a again, propagated in the phosphor part 2, and then emitted from the incident face 2a.

Figure 3B:
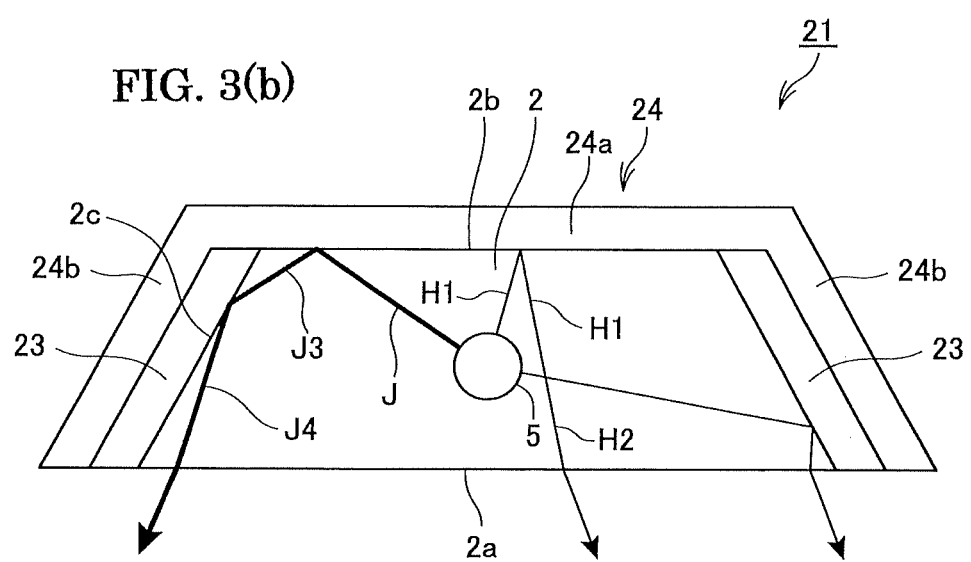

On the other hand, according to a comparative example shown in FIG. 3(b), the shape of the phosphor part 2 is made the same as that of the phosphor part 2 of FIG. 3(a). Then, a low refractive index layer 23 is provided on the side face 2c of the phosphor element 2. However, a low refractive index layer is not provided on the opposing face 2b of the phosphor part 2. Further, a reflection layer 24b is provided on the low refractive index layer 23, a reflection layer 24a is provided on the opposing face 2b of the phosphor part 2, and the reflection films 24a and 24b together form an integral reflection film 24.

Further, in this case, the fluorescence reflected from the phosphor particles 5 toward the opposing face side as arrows H1 is reflected at the reflection film 24a, propagates in the phosphor part 2 as an arrow H2, and is emitted from the incident face 2a.

On the other hand, as shown in FIG. 3(a), as the fluorescence radiated diagonally from the phosphor particles 5 toward the opposing face as an arrow J satisfies the total reflection condition at the low refractive index layer 3a, the fluorescence is subjected to total reflection as an arrow J1, further subjected to total reflection at the interface between the low refractive index layer 3b and phosphor part 2 as an arrow J2, and then emitted from the incident face 2a.

Contrary to this, according to a phosphor element 21 shown in FIG. 3(b), the fluorescence radiated diagonally from the phosphor particles 5 toward the opposing face as an arrow J1 is reflected at the reflection film 24a provided on the opposing face 2b as an arrow J3, further subjected to total reflection at the interface between the low refractive index layer 23 and phosphor part 2 as an arrow J4 and emitted from the incident face 2a. In this case, the amount of absorption of optical energy at the reflection film 24a is large and the temperature of the reflection film 24 is raised, resulting in a deterioration of heat dissipation from the phosphor part 2 and increase of the temperature. The intensity of the fluorescence emitted from the incident face 2a is decreased due to temperature quenching in the phosphor.

Figure 4:
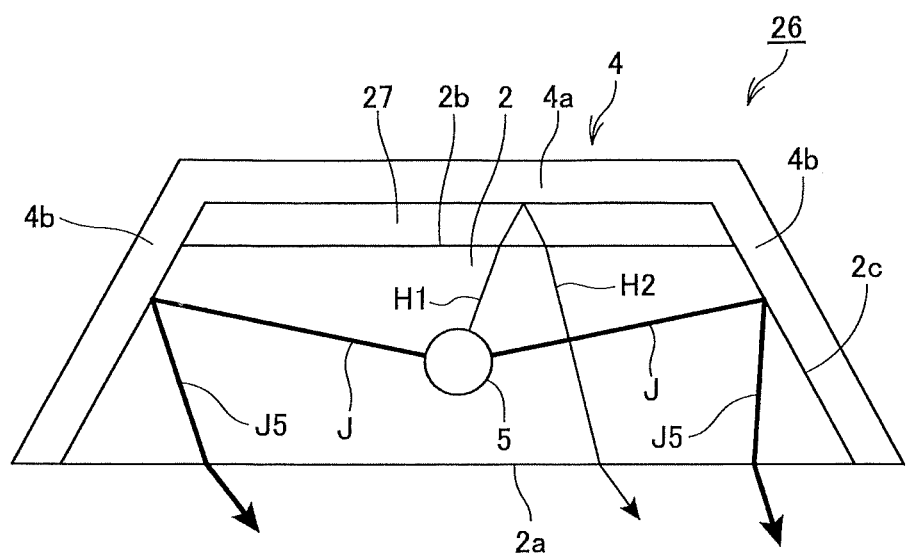
FIG. 4 is a schematic view showing the propagation route of light in a phosphor element 26 according to a comparative example.

On the other hand, according to the phosphor element 26 of a comparative example shown in FIG. 4, the shape of the phosphor part 2 is made the same as that of the phosphor part 2 shown in FIG. 3(a). Then, a low refractive index layer 27 is provided on the opposing face 2b of the phosphor element 2 and a low refractive index layer is not provided on the side faces 2c. The reflection films 4a and 4b together form an integral reflection film 4.

Further, in this case, the fluorescence reflected from the phosphor particles 5 as the arrow H1 toward the opposing face side is then reflected at the reflection film 4a, propagates in the phosphor part 2 as the arrow H2 and is emitted from the incident face 2a.

On the other hand, as shown in FIG. 3(a), the fluorescence radiated diagonally from the phosphor particles 5 as an arrow J toward the opposing face is subjected to total reflection as an arrow J1, further subjected to total reflection at the interface between the low refractive index layer 3b and phosphor part 2 as an arrow J2, and emitted from the incident face 2a.

Contrary to this, according to the phosphor element 26 shown in FIG. 4, the fluorescence radiated diagonally from the phosphor particles 5 as an arrow J toward the side faces is subjected to total reflection at the reflection film 4b on the side faces as an arrow J5, and emitted from the incident face 2a. In this case, as the fluorescence is subjected to total reflection at the reflection film 4b, the amount of absorption of optical energy is large and the temperatures of the reflection film 4b and the integrated reflection film 4a are raised, resulting in the deterioration of the heat dissipation of the phosphor part 2 and temperature rise thereof. The intensity of the fluorescence emitted from the incident face 2a is decreased over time due to the temperature quenching in the phosphor.

The phosphor device of the present invention includes a phosphor part having an incident face of an excitation light, an opposing face opposing the incident face and a side face, and the phosphor part converts at least a part of the excitation light incident onto the incident face to a fluorescence and emits the fluorescence from the incident face.

Here, in the case that the whole of the excitation light is converted to the fluorescence, only the fluorescence is emitted from the incident face. Alternatively, a part of the excitation light may be converted into the fluorescence so that the fluorescence and excitation light may be emitted from the incident face.

Although the phosphor constituting the phosphor part is not limited as far as it can convert the excitation light into the fluorescence, it includes a phosphor glass, phosphor single crystal and phosphor polycrystal.

Further, a scattering material may be added or pores may be formed in the phosphor for scattering the excitation light and fluorescence. In this case, the light incident into the phosphor is scattered in the phosphor so that the emitted lights (excitation light and fluorescence) are scattered and the scattering angle is larger.

The scattering angle in the phosphor can be measured by a scattering measuring system "Mini-Diff" supplied by Cybernet Systems Co., Ltd., for example. The scattering angle is defined as a total angle width at which it takes a value of $1/e^2$ of the peak value in transmittance spectrum of the emitted light.

At the time, the scattering angle may preferably be 5° or more and more preferably be 10° or more. Then, although the upper limit of the scattering angle of the phosphor forming the phosphor part is not particularly defined, it may be not larger than the numerical aperture (NA) of the emitted light and may be 80° or smaller on a practical viewpoint.

The phosphor glass means a base glass into which ions of a rare earth element is dispersed.

As the glass serving as the base, oxide glasses containing silica, boron oxide, calcium oxide, lanthanum oxide, barium oxide, zinc oxide, phosphorus oxide, aluminum fluoride, magnesium fluoride, calcium fluoride, strontium fluoride, or barium chloride may be exemplified.

Though the rare earth ions diffused in the phosphor glass are preferably Tb, Eu, Ce, or Nd, the rare earth ions may be La, Pr, Sc, Sm, Er, Tm, Dy, Gd, or Lu.

As the phosphor monocrystal, $Y_3Al_5O_{12}$, $Ba_5Si_{11}Al_7N_{25}$, $Tb_3Al_5O_{12}$, and YAG (yttrium.aluminum.garnet) are preferable. A part of the Y (yttrium) of YAG may be replaced with Lu. Further, a dopant doped into the phosphor single crystal may preferably be a rare earth ion and particularly preferably be Tb, Eu, Ce, and Nd, and the rare earth ions may be La, Pr, Sc, Sm, Er, Tm, Dy, Gd, or Lu.

Further, as the phosphor polycrystal, TAG (terbium.aluminum.garnet) series, sialon series, nitride series, BOS (barium.orthosilicate) series, and YAG (yttrium.aluminum.garnet) are exemplified. A part of the Y (yttrium) of YAG may be replaced with Lu.

Further, a dopant doped into the phosphor polycrystal may preferably be a rare earth ion and particularly preferably be Tb, Eu, Ce, and Nd, and the rare earth ions may be La, Pr, Sc, Sm, Er, Tm, Dy, Gd, or Lu.

Further, the phosphor device of the present invention may be a non-grating type phosphor device which does not include a grating within the phosphor part, or a grating device, in which the grating is provided in the phosphor part.

The phosphor part includes at least an incident face of an excitation light, an opposing face and a side face. The side face means a face extending between the incident face and opposing face. Here, the shape of the phosphor part is not particularly limited. For example, the shape of the incident face or opposing face of the phosphor part may be a circle, ellipse, or a polygon such as a triangle, rectangle or hexagon.

According to the present invention, an integral low refractive index layer is provided on the side face and opposing face of the phosphor part having a refractive index lower than a refractive index of the phosphor part.

Here, the low refractive index layers are provided on the side face and opposing face of the phosphor part and the low refractive index layers are integral, meaning that the low refractive index layers are continuous with each other. However, it is not necessary that the low refractive index layer covers the whole of the side face and opposing face, it is permitted that a part of the side face or a part of the opposing face is not covered with the low refractive index layer and is exposed. However, even in this case, it is preferred that 90 percent or more of the total area of the side face or 90 percent or more of the total area of the opposing face is covered with the low refractive index layer. It is more preferred that the whole of the side face and opposing face is covered with the low refractive index layer.

As the material of the low refractive index layer, aluminum oxide, magnesium oxide, aluminum nitride, tantalum oxide, silicon oxide, silicon nitride, aluminum nitride and silicon carbide are exemplified. From the viewpoint of the heat dissipation, the material of the low refractive index layer may most preferably be aluminum oxide or magnesium oxide.

Further, as the refractive index of the low refractive index layer is made lower than the refractive index of the phosphor, it is possible to utilize the total reflection due to the difference of the refractive indices of the phosphor and low refractive index layer, to reduce the optical component reflected at the reflection film and to suppress the absorption of the light by the reflection at the reflection film. The refractive index of the low refractive index layer may preferably be 1.7 or lower and more preferably be 1.6 or lower. The lower limit of the refractive index of the low refractive index layer is not particularly limited and is 1 or higher, and may be 1.4 or higher from a practical viewpoint. Further, the difference of the refractive indices of the phosphor part and low refractive index layer may preferably be 0.1 or larger and more preferably be 0.2 or larger.

Further, the refractive index of the phosphor part may preferably be 1.4 to 1.9 and more preferably be 1.65 to 1.85.

The thickness of the low refractive index layer may preferably be 1 μm or smaller so that it is possible to reduce the influences on the heat dissipation. Further, the thickness of the low refractive index layer may preferably be 0.05 μm or larger from the viewpoint of suppressing the absorption by the reflection film.

The phosphor element of the present invention includes an integral reflection layer covering the surface of the low refractive index layer. The reflection film is integral, meaning that the reflection film is integrally formed. However, it is not necessary that the whole of the side face and opposing face are covered with the reflection film and it is permitted that a part of the side face or apart of the opposing face of the low refractive index layer is not covered with the reflection layer and is exposed. However, even in this case, it is preferred that 90 percent or more of the total area of the side face or 90 percent or more of the opposing face is covered with the reflection film and it is more preferred that the whole of the side face and opposing face is covered with the reflection film.

The material of the reflection film is not particularly limited as long as it is possible to reflect the excitation light and fluorescence passing through the phosphor layer. It is not necessary that the excitation light is reflected by the reflection film by total reflection and that a part or whole of the excitation light may be transmitted through the reflection film.

According to a preferred embodiment, the reflection film is a metal film, dielectric multi-layered film, or a combination thereof.

In the case that the reflection film is composed of the metal film, the reflection can be performed in a wide wavelength range, the dependency on the incident angle can be lowered, and its temperature-resistance and weather-resistance are excellent. On the other hand, in the case that the reflection film is composed of the dielectric multi-layered film, as the absorption is avoided, it is possible to convert the incident light incident in a specific angle to the reflection light by 100 percent without loss, and as the reflection film can be formed with oxide films, it is possible to improve the adhesion with the bonding layer to prevent separation.

In the case of the combination, it is possible to obtain characteristics complimenting each other.

The reflectivity of the excitation light by the reflection film is 80 percent or higher and preferably 95 percent or higher.

The dielectric multi-layered film is a film formed by alternately laminating high refraction materials and low reflection materials. The high reflection material includes $TiO_2$, $Ta_2O_5$, ZnO, $Si_3N_4$ and $Nb_2O_5$. Further, the low refraction material includes $SiO_2$, $MgF_2$ and $CaF_2$. The number of laminations and total thickness of the dielectric multi-layered film are appropriately selected depending on the wavelength of the fluorescence to be reflected.

The material of the metal film may preferably be the following.

(1) a single layered film such as Al, Ag or Au
(2) a multi-layered film such as Al, Ag or Au Although the thickness of the metal film is not particularly limited as long as the fluorescence can be reflected, the thickness may preferably be 0.05 µm or larger and more preferably be 0.1 µm or larger. Further, for improving the adhesion of the metal film and substrate, it may be formed through a metal film such as Ti, Cr, Ni or the like.

According to the present invention, the area of the incident face of the phosphor part is larger than the area of the opposing face. The low refractive index layer, reflection film and the shape of the phosphor part having the opposing face having the smaller area are combined, so that the excitation light and fluorescence are emitted from the incident face while the number of reflections of the excitation light and fluorescence in the phosphor part can be lowered due to the mechanism described above. The heat generation due to the absorption by the reflection film can be thereby suppressed and the dissipation of the heat generated due to the propagation of light in the phosphor part can be facilitated.

According to the present invention, the area AI of the incident face 2a is larger than the area AR of the opposing face 2b, so that the intensity of the fluorescence emitted from the incident face can be improved as described above. From this viewpoint, the area AI of the incident face 2a/area AR of the opposing face 2b may preferably be 1.2 or larger and more preferably be 1.47 or larger. Further, from a practical viewpoint, the area AI of the incident face 2a/area AR of the opposing face 2b may preferably be 27.2 or smaller and more preferably be 11 or smaller.

From a similar viewpoint, the inclination angle θ of the side face with respect to the incident face of the phosphor part may preferably be 50° or more and 85° or less, and most preferably be 60° and more and 80° or less. According to the present embodiment, although the scattering material may be dispersed in the phosphor material, particularly preferably, the scattering material is not dispersed in the phosphor material forming the phosphor part.

Further, the thickness T (FIGS. 1 and 7) of the phosphor part (distance between the incident face and opposing face) may preferably be 290 µm or larger; more preferably be 300 µm or larger, may be 450 µm or larger and further 800 µm or larger, for improving the extraction efficiency of the fluorescence on the emitting side. However, the thickness may preferably be 3.0 mm or smaller, from the viewpoint of miniaturization, and may preferably be 1.5 mm or smaller, from the viewpoint of heat dissipation.

According to a preferred embodiment, a partial transmission film composed of a material transmitting the excitation light and fluorescence may be provided on the incident face of the phosphor part. The partial transmission film is a film reflecting a part of the excitation light and transmitting the remainder. Specifically, the reflectivity of the partial transmission film with respect to the excitation light is 9 percent or higher and is preferably 50 percent or lower. The material of the partial transmission film includes the metal film or the dielectric multi-layered film for the reflection film as described above.

Further, according to a preferred embodiment, it may be provided at an incident face-side supporting substrate on the incident face of the phosphor part, so that the heat dissipation effects through the phosphor part can be further improved. Further, according to another embodiment, an opposing face-side supporting substrate may be provided on the main face on the opposing face side of the heat dissipating substrate, so that the heat dissipation effects through the heat-dissipating substrate can be further improved.

Here, the material of each of the supporting substrates may preferably be a material having a thermal conductivity (25° C.) of 200 W/mK or higher and particularly preferably of 300 W/mK or higher. Although the upper limit of the thermal conductivity of the material is not particularly limited, it may be made 500 W/mK or lower, from the viewpoint of practical availability.

Here, the material of each of the supporting substrates may preferably be transparent or translucent for transmitting light. However, a window may be provided in the incident face-side supporting substrate for irradiating the excitation light onto the incident face and, in this case, the material of the incident face-side supporting substrate is not necessarily transparent or translucent.

In the case that the materials of the respective supporting substrates are transparent or translucent, the materials of the supporting substrates may preferably be alumina, aluminum nitride, silicon carbide, quartz, or a glass.

In the case that the material of each of the supporting substrates is not transparent or translucent, the material of the supporting substrate may preferably be alumina, aluminum nitride, silicon carbide, quartz, a glass, copper, silver, gold, aluminum or an alloy material containing the metal. The materials of the respective supporting substrates may be the same or different from each other.

Figure 5:
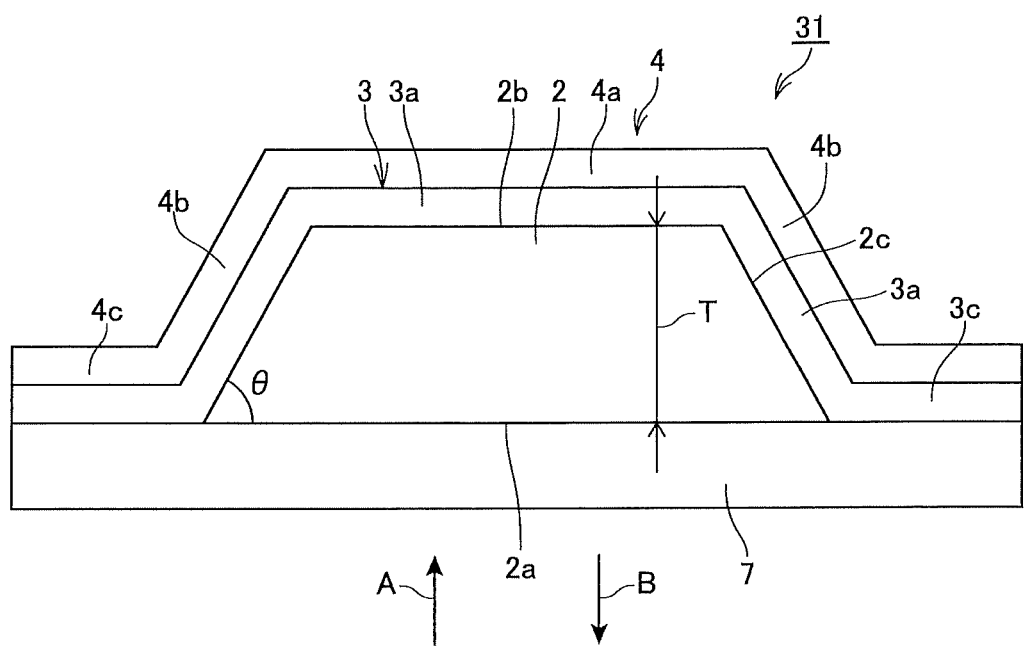
FIG. 5 is a cross-sectional view showing a phosphor element 31 according to another embodiment of the present invention.

According to a phosphor element 31 shown in FIG. 5, a transparent or translucent supporting substrate 7 is formed on the incident face 2a of the phosphor part 2. According to the present example, the supporting substrate 7 is extended over the phosphor part 2 and a low refractive index layer 3c and reflection film 4c are extended thereon.

Further, according to a preferred embodiment, a heat-dissipating substrate is provided contacting the reflection film. The material of the heat-dissipating substrate may preferably have a thermal conductivity (25° C.) of 200 W/m·K or higher. Although the upper limit of the thermal conductivity is not particularly limited, it may preferably be 500 W/m·K or lower and more preferably be 350 W/m·K or lower from the viewpoint of practical applicability.

The material of the heat-dissipating substrate may preferably be gold, silver, copper, aluminum or an alloy containing the metals.

Further, the material of the heat-dissipating substrate may, preferably be a ceramic material such as silicon carbide and aluminum nitride. In the case of the ceramic material, the thermal expansion coefficient can be matched with that of the phosphor to some degree. It is thus advantageous in that the reliability can be improved, for example, the cracks or fracture due to thermal stress can be prevented.

In the case that the heat-dissipating substrate is composed of a metal, it may be composed of a metal plating film.

The kind of metal plating film may be an electroplating film or electroless plating film. Further, the metal plating film is composed of a metal having a thermal conductivity (25° C.) of 200 W/mK or higher.

The kind of metal forming the metal plating film of the phosphor part may particularly preferably be gold, silver, copper, aluminum, or an alloy containing the metal.

Figure 6:
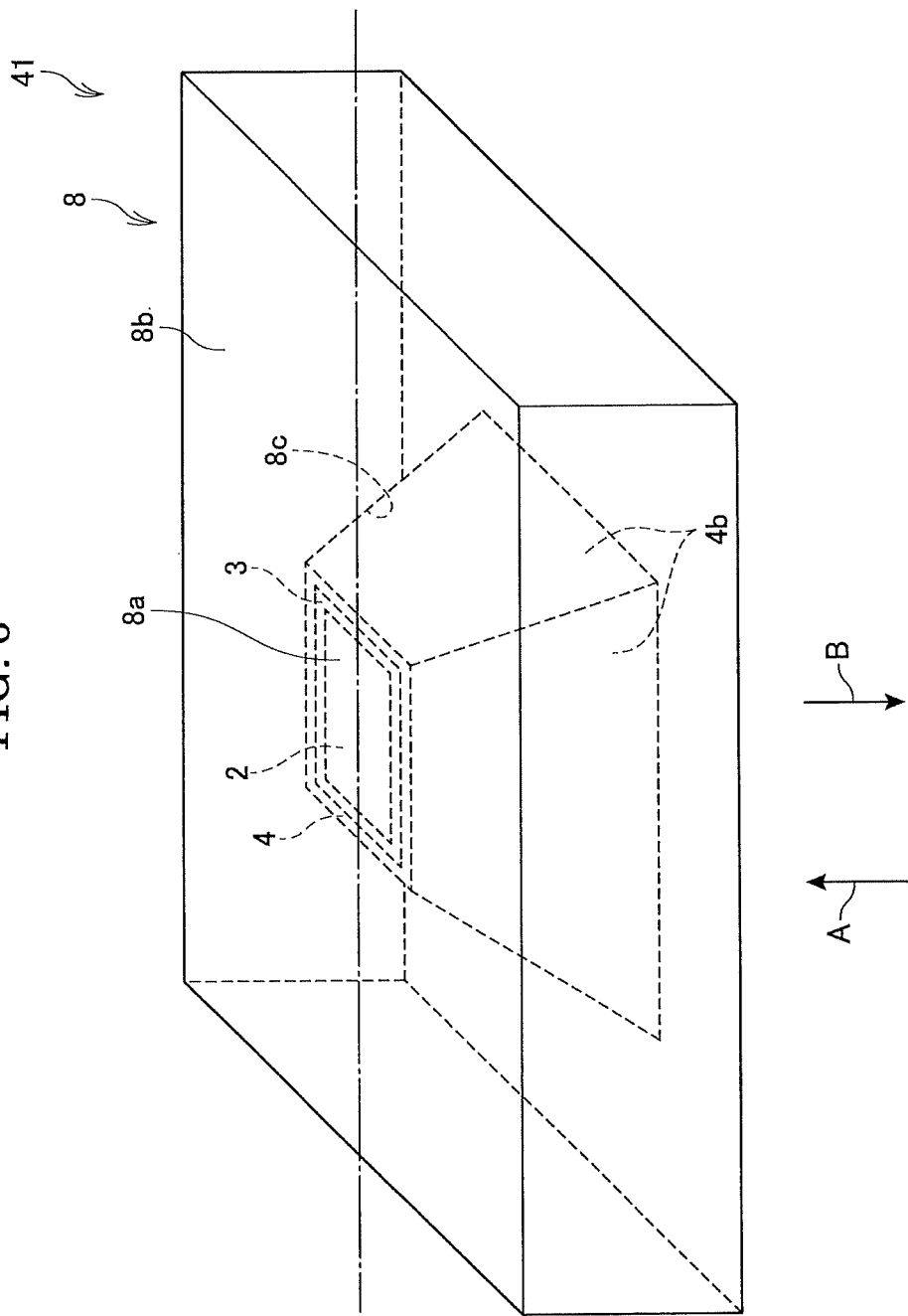
FIG. 6 is a perspective view showing a phosphor element 41 according to still another embodiment of the present invention.

According to a phosphor element 41 shown in FIGS. 6 and 7, the phosphor part 2, low refractive index layer 3 and reflection film 4 are the same as those of the phosphor element of FIG. 1. However, according to the present example, the phosphor part 2, low refractive index layer 3 and reflection film 4 are fixed in and integrated with a recess 8c of the heat-dissipating substrate 8. However, 8a represents a thin plate part contacting the reflection film 4a, and 8b represents a flange part having a constant thickness and contacting the reflection film 4b.

This recess of the heat-dissipating substrate can be formed by mechanical processing or laser processing. Alternatively, the heat-dissipating substrate can be formed by a plating or thermal spraying method. Further, in the case that the heat-dissipating substrate is composed of a metal, the heat-dissipating substrate can be bonded to the phosphor element with a sintering type bonding material. Further, in the case that the heat-dissipating substrate is composed of a ceramic material, the heat-dissipating substrate can be bonded to the phosphor element with a sintering type bonding material.

The kind of metal plating film may be an electroplating film or an electroless plating film. Further, the metal plating film is composed of a metal having a thermal conductivity (25° C.) of 200 W/mK or higher.

The kind of metal forming the metal plating film on the phosphor part may particularly preferably be gold, silver, copper, aluminum or an alloy containing the metal.

An underlying film for plating may be present between the reflection film and heat-dissipating substrate. The underlying film may be composed of Ni, Cr, Ti or an alloy containing the metal.

Further, the illumination device of the present invention includes a light source oscillating laser light and the phosphor element described above.

As the light source, a semiconductor laser using an GaN material and having high reliability for excitation of a phosphor for illumination is preferred. A light source such as a laser array with laser elements arranged one-dimensionally can further be realized. A super luminescence diode, semiconductor optical amplifier (SOA) or LED may be used. Further, the excitation light from the light source may be made incident onto the phosphor element through an optical fiber.

Although the method of generating white light from the semiconductor laser and phosphor is not particularly limited, the following methods are considered.

Method of generating a yellow fluorescence from a blue light laser and phosphor to obtain a white light.

Method of generating a red and green fluorescence from a blue laser and phosphor to obtain a white light Further, a method of generating a red, blue and green fluorescence by a phosphor from a blue laser or ultraviolet laser to obtain a white light Method of generating a blue and yellow fluorescence by a phosphor from a blue laser or ultraviolet laser to obtain a white light The manufacturing method of the present invention includes the steps of:

bonding a phosphor substrate having a first main face and second main face to a handle substrate at the second main face;

processing the first main face of the phosphor substrate to form the opposing face and side face to provide the phosphor part;

film-forming the reflection film so as to cover the opposing face and side face; and separating the phosphor part from the handle substrate.

According to such a manufacturing method, it is possible to shape many specific phosphor elements in a single phosphor substrate at the same time, so that the productivity can be improved.

According to a preferred embodiment, the step of film-forming the low refractive index layer on the side face and opposing face of the phosphor part to form the reflection film on the low refractive index layer is provided. According to the manufacturing method, it is possible to obtain the phosphor element of the present invention with a high productivity.

The manufacturing method will be exemplified referring to the drawings below.

Figure 8A:
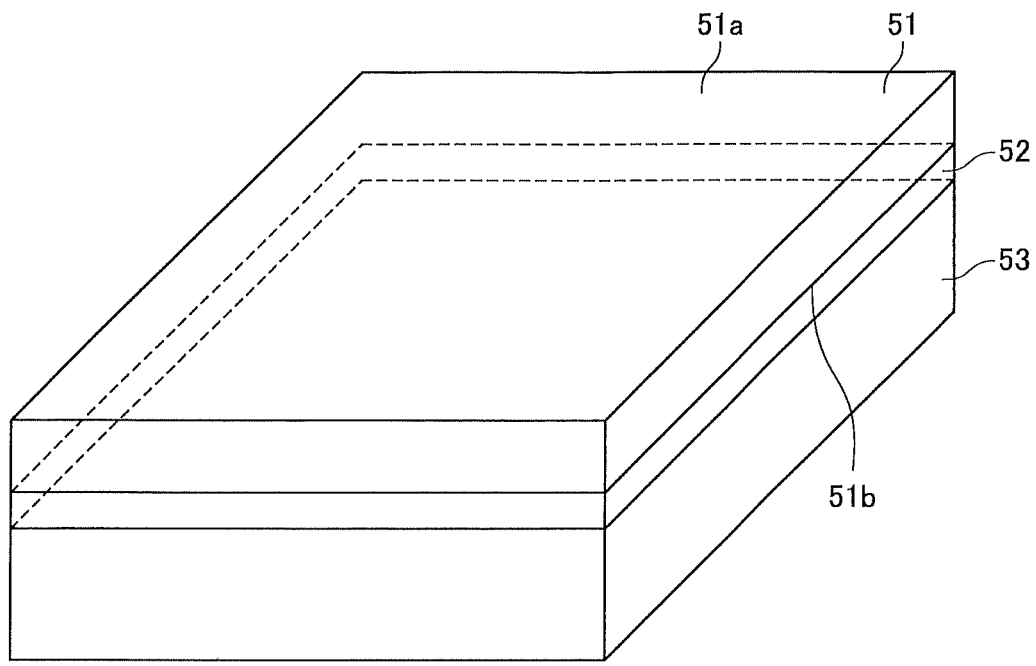
FIG. 8(*a*) shows the state that a phosphor substrate 51 of a phosphor is bonded to a handle substrate 53 and FIG. 8(*b*) shows the state that a plurality of phosphor parts 2 are formed by processing the phosphor substrate.
Figure 8B:
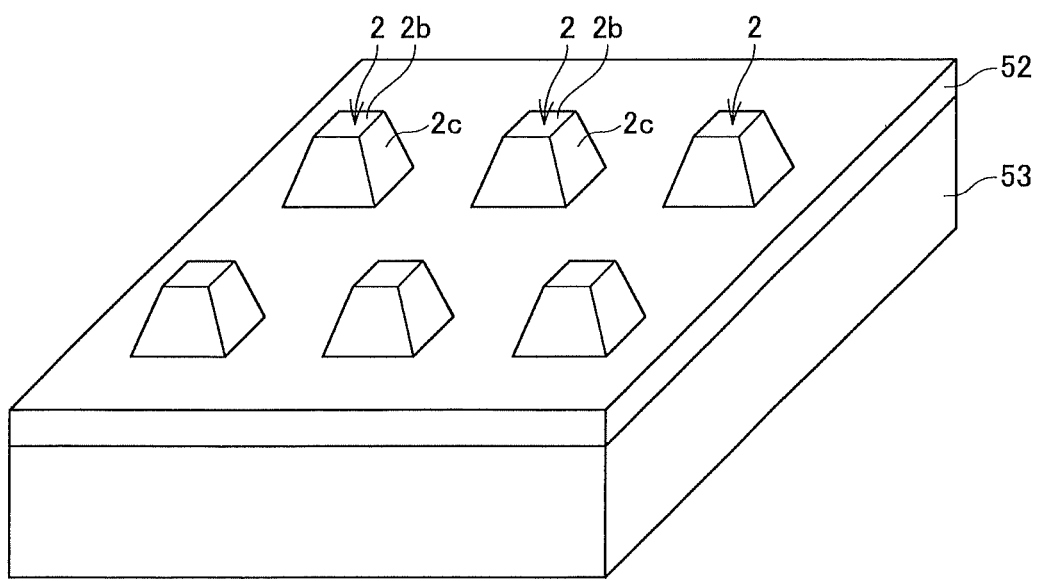

As shown in FIGS. 8(a) and 8(b), a bonding layer 52 is formed on the handle substrate 53 and then opposed to a phosphor substrate 51 and a second main face 51b of the phosphor substrate 51 is bonded onto the handle substrate 53.

Then, a first main face 51a of the phosphor plate 51 on the handle substrate 53 is processed to form a phosphor part having the necessary shape. For example, according to the example of FIG. 8(b), the phosphor part 2 having the desired shape is formed on the bonding layer 52. This processing method includes dicing, slicing, micro grinder, laser processing, water jet and micro blasting.

Figure 9:
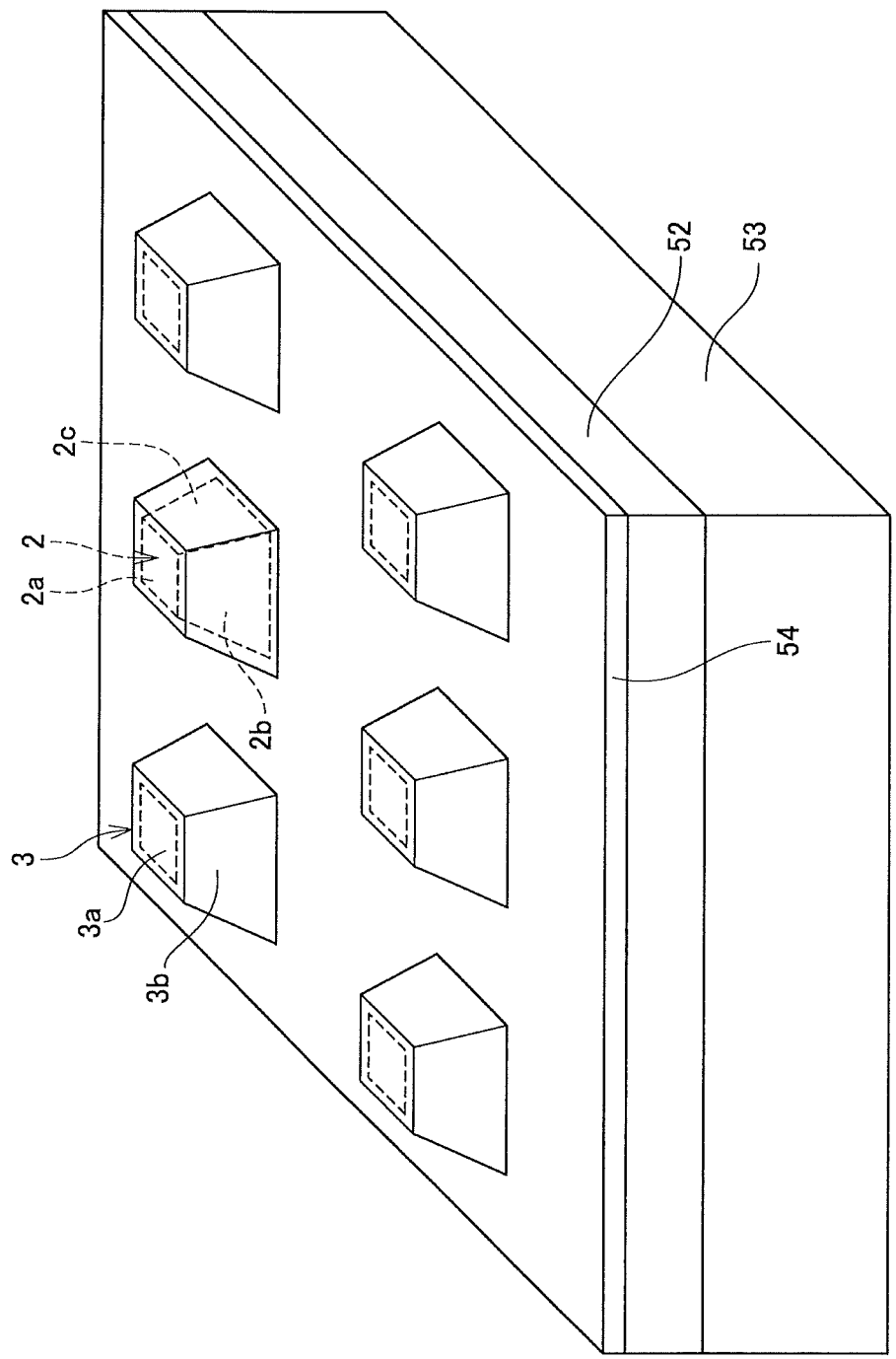
FIG. 9 is a perspective view showing the state that a low refractive index layer 54 is provided on a bonding layer 52 and phosphor part 2.
Figure 10:
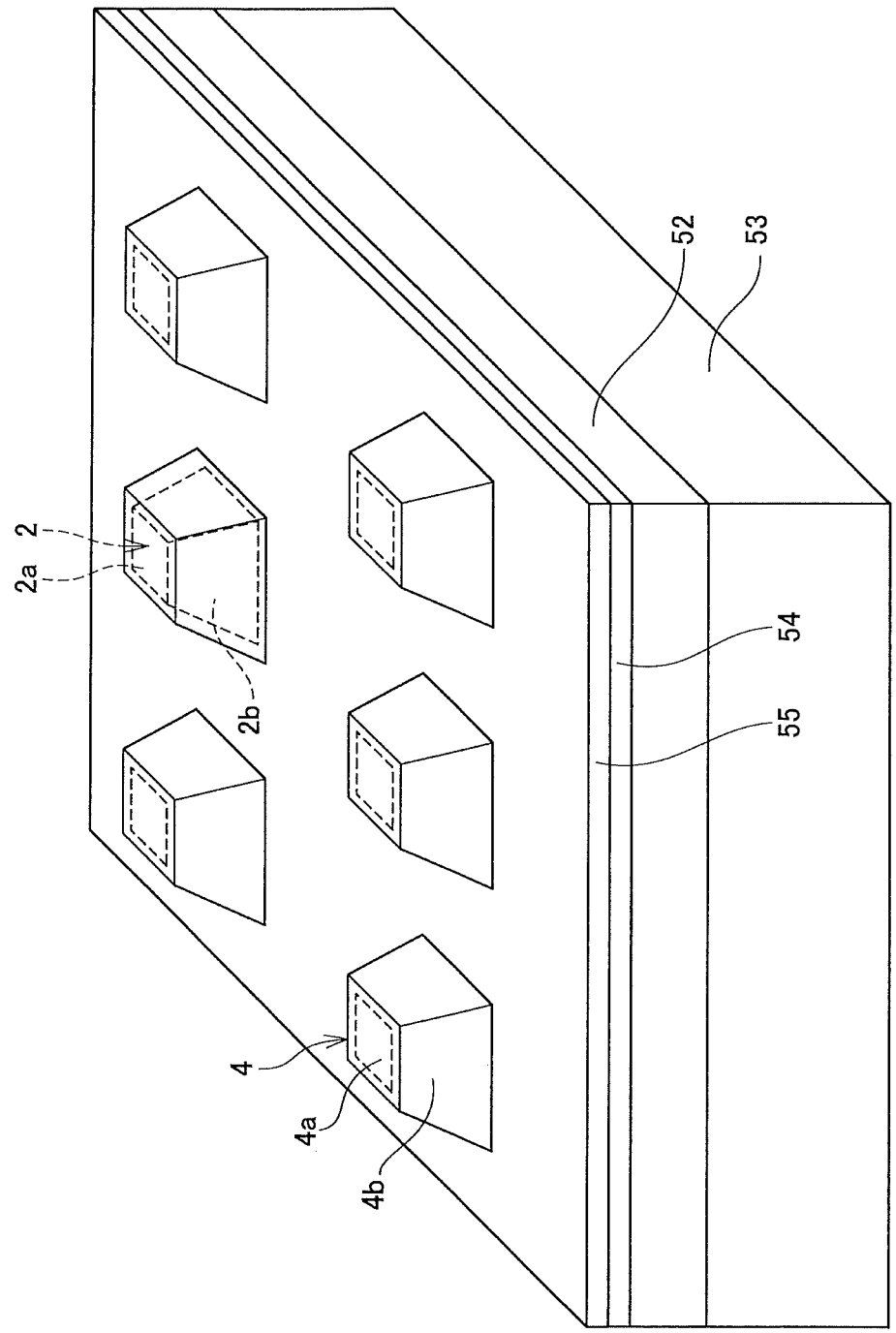
FIG. 10 is a perspective view showing the state that a reflection film 55 is provided on the low refractive index layer 54.

Then, according to a preferred embodiment, as shown in FIG. 9, a low refractive index layer 54 is formed on the phosphor part 2 and bonding layer 52. Then, as shown in FIG. 10, a reflection layer 55 is formed on the low refractive index layer 54.

The handle substrate and bonding layer are then removed to obtain a substrate including many phosphor elements 1, as shown in FIG. 1, formed therein. The phosphor elements 1 can then be cut into predetermined dimensions. Alternatively, a plurality of the phosphor elements 1 can be utilized as a phosphor element array without separating the phosphor elements by cutting.

Although the method of forming the low refractive index layer and reflection film is not particularly limited, vapor deposition, sputtering and CVD methods are preferred. In the case of the vapor deposition method, ion-assist can be added to perform the film-formation.

According to the inventive method, the reflection layer (and optionally the low refractive index layer) can be film-formed on the side face and opposing face by a single film-forming step. For example, in the case that the side face and opposing face intersect each other as shown in FIG. 2(b), it is not possible to form the reflection film or low refractive index layer on the side face and opposing face by a single film-formation step. In the case that a plurality of the film-forming steps is performed, there is the possibility that distribution is provided in the refractive index or the cost is increased due to the number of the steps. These problems can be avoided by the present manufacturing method.

Further, according to a preferred embodiment, a scattering material is dispersed in the phosphor part, the thickness of the phosphor part (distance between the incident face and opposing face) is 290 μm or larger and 1.0 mm or smaller, and the inclination angle θ of the side face with respect to the incident face is 25° or more and 49° or less. It is found that a high light-emission efficiency and low color unevenness can be realized even when θ is small in the case that the scattering material is dispersed in the phosphor part and the phosphor part is relatively thin.

According to a preferred embodiment, the thickness T (distance between the incident face and opposing face) of the phosphor part may preferably be 300 μm or larger and preferably be 650 μm or smaller. Further, the inclination angle θ of the side face with respect to the incident face may preferably be 30° or more or 46° or less.

In the case that the scattering material is dispersed in the phosphor part, it is preferred that the scattering material does not absorb the excitation light and fluorescence and that the difference of the refractive indices of it and the phosphor is larger, and $Al_2O_3$, $SiO_2$, $TiO_2$ and $ZrO_2$ are exemplified.

Further, according to a preferred embodiment, the scattering material is not contained in the phosphor part, the distance between the incident face and opposing face is 290 μm or larger and 1.0 mm or smaller, and the inclination angle of the side face with respect to the incident face is 25° or more and 70° or less. It is found that a high light-emission efficiency and low color unevenness can be realized, even when α is 50° or more as well as when 0 is small, in the case that the scattering material is dispersed in the phosphor part and that the phosphor part is relatively thin.

According to the present embodiment, it is preferred that the inclination angle of the side face with respect to the incident face is 25° or more and 42° or less or 49° or more and 65° or less. The inclination angle of the side face with respect to the incident face may more preferably be 40° or less.

Similarly, even in the case that the phosphor part is relatively thin, the performance in the case that the scattering material is not contained in the phosphor part is different from that in the case that the scattering material is dispersed in the phosphor part.

Figure 11:
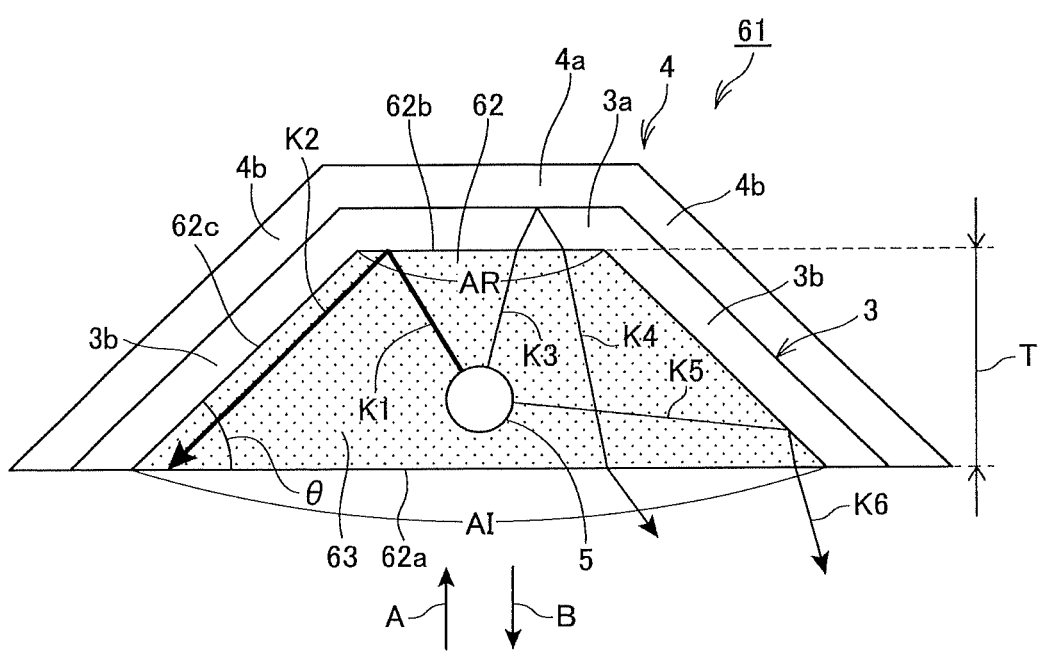
FIG. 11 is a cross-sectional view schematically showing a phosphor element 61 according to still another embodiment.

FIG. 11 is a cross-sectional view schematically showing a phosphor element 61 according to the present embodiment.

According to the phosphor element 61 shown in FIG. 11, a phosphor part 62 includes an incident face 62a, emitting face 62b and four side faces 62c. At the cross section of the phosphor part, the phosphor part has a shape substantially of a trapezoid, and an angle 9 of the side face 62c with respect to the incident face 62a is an acute angle less than 90°, preferably 49 to 25°. Then, the area AI of the incident face 2a is larger than the area AR of the opposing face 2b. Many scattering materials 63 are dispersed in the phosphor part 62.

A low refractive index layer 3b is provided on the side face 62c of the phosphor part 62, the low refractive index layer 3c is provided on the opposing face 62b, and the low refractive index layers 3a and 3b together form an integral low refractive index layer 3. According to the present example, the low refractive index layer 3 covers the whole of the side faces 62c and opposing face 62b of the phosphor part 62. Further, according to the present example, the reflection film 4a is provided on the low refractive index layer 3a, the reflection film 4b is provided on the low refractive index layer 3b, and the reflection films 4a and 4b together form an integral reflection film 4. According to the present example, the reflection film 4 covers the whole of the low refractive index layer 3.

As shown in FIG. 11, according to the phosphor element 61 of the present invention, the excitation light incident as an arrow A collides onto many phosphor particles 5 dispersed in the phosphor part 62. Then, a fluorescence is emitted from the respective phosphor particles 5 as arrows K1, K3 and K5. At this time, there is the tendency that the fluorescence is radiated from the phosphor particle uniformly in every direction. In addition to this, the fluorescence radiated from the phosphor particles is further scattered in every direction by the scattering material, so that the fluorescence is further uniformly radiated.

Here, the fluorescence radiated from the phosphor particles in the direction of the incident face 62a is emitted from the incident face 62a as such. Further, the fluorescence radiated from the phosphor particle in the direction of the opposing face 62b as an arrow K3 is refracted at the low refractive index layer 3a, then reflected at the reflection film 4a, refracted at the low refractive index layer 3a again and emitted from the incident face 2a as an arrow K4. The fluorescence diagonally radiated as arrows K1 and K5 is reflected at the low refractive index layer 3a and 3b by total reflection and then emitted from the incident face 2a as arrows K2 and K6. At this time, as the area AI of the incident face of the phosphor part 62 is larger than the area AR of the opposing face and the side face 62c is inclined, the directions of the reflected light K2 or K6 are further inclined toward the inclination face 2a by the inclination angle θ. As a result, it is possible to reduce the number of reflections until the excitation light is emitted from the incident face 62a. It is further possible to suppress the absorption of light at the reflection film 4 and temperature rise of the reflection film due to the presence of the low refractive index layers 3a and 3b.

Figure 12:
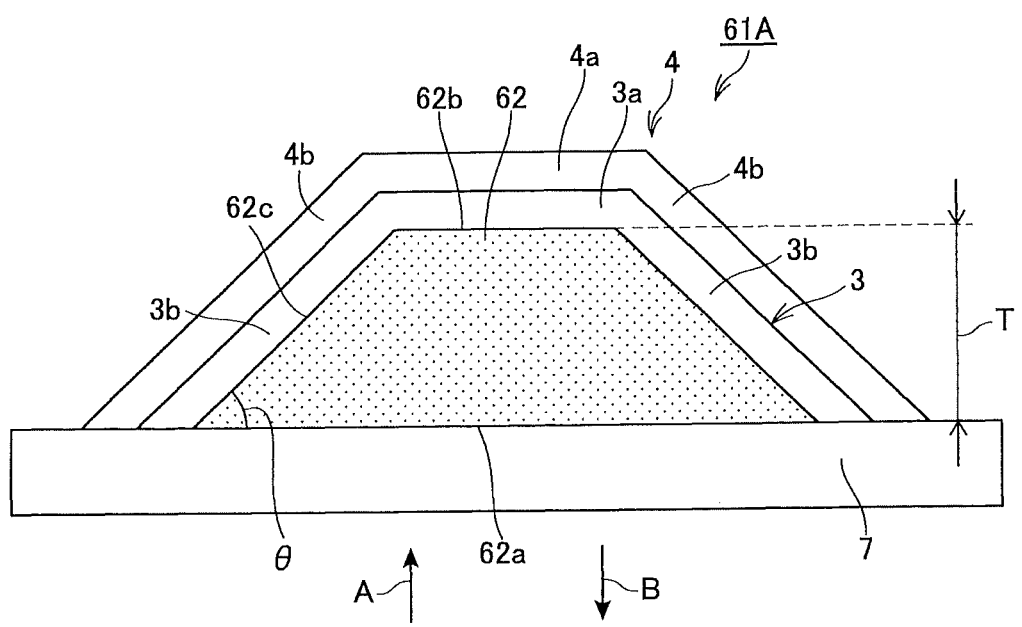
FIG. 12 is a cross-sectional view showing a phosphor element 61A according to still another embodiment.

According to a phosphor element 61A shown in FIG. 12, a transparent or translucent supporting substrate 7 is formed on the incident face 62a of the phosphor part 62.

Figure 13:
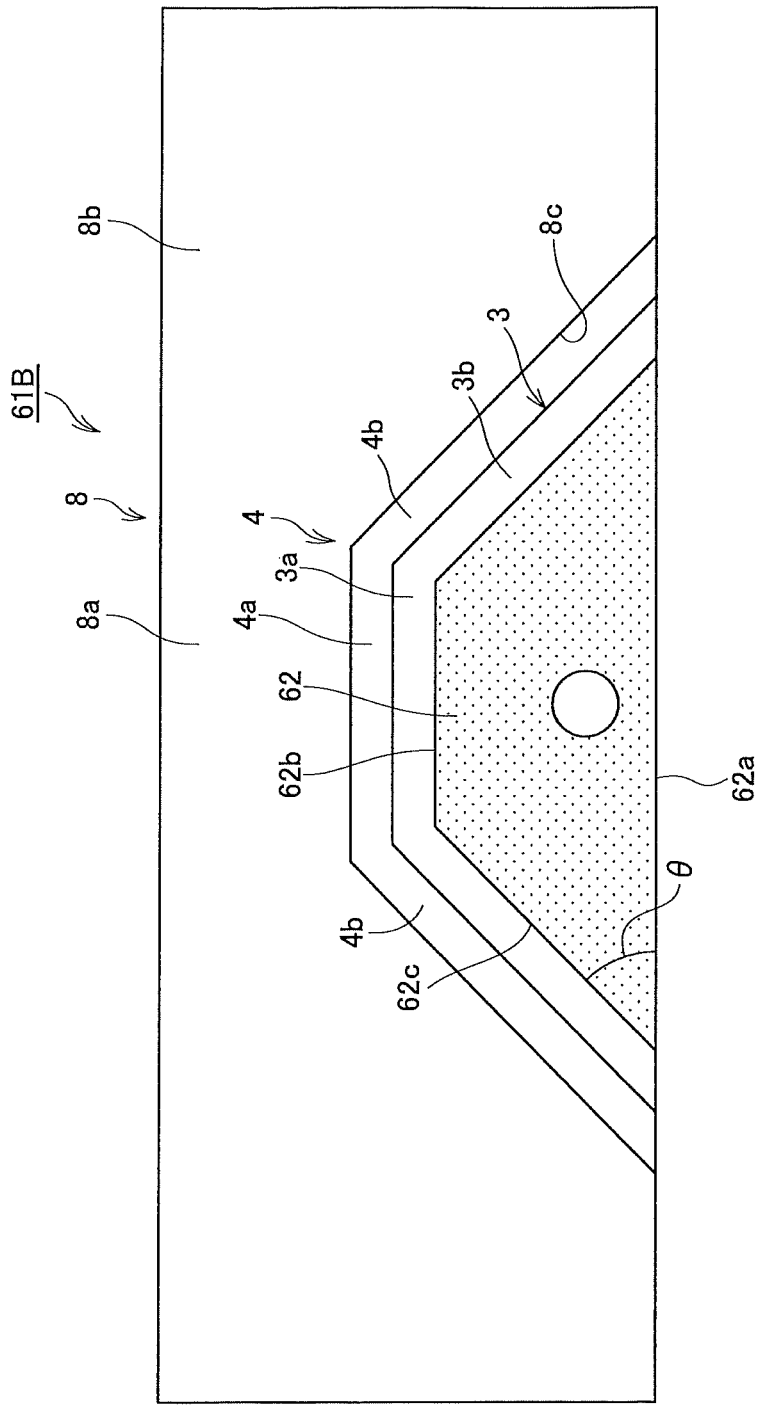
FIG. 13 is a cross-sectional view schematically showing a phosphor element 61B according to still another embodiment.

According to a phosphor element 61B shown in FIG. 13, the phosphor part 62, low refractive index layer 3 and reflection film 4 are the same as those of the phosphor element 61 shown in FIG. 11. However, according to the present example, the phosphor part 62, low refractive index layer 3 and reflection film 4 are fixed and integrated in a recess 8c of the heat-dissipating substrate 8. Further, 8a represents a thin plate part contacting the reflection film 4a, and 8b represents a flange part having a constant thickness and contacting the reflection film 4b.

EXAMPLES

Inventive Example 1

The phosphor 41 shown in FIGS. 6 and 7 were produced by the production method described referring to FIGS. 8 to 10.

Specifically, a phosphor plate 51 was prepared having a thickness of 1 mm, a diameter of 4 inches and composed of YAG (yttrium.aluminum.garnet) polycrystal doped with Ce and added with a ceramic dispersing material. Further, a sapphire wafer was prepared having a thickness of 0.3 mm and a diameter of 4 inches as the handle substrate 53. The phosphor plate 51 was bonded with the handle substrate 53 through a thermoplastic resin 52 at 100° C. and then cooled to ambient temperature to integrate them (FIG. 8(*a*)).

Then, set-back processing was performed by dicing using a blade of a thickness of 100 μm and #800. Then, similarly, the phosphor plate was rotated by 90° and subjected to the set-back processing by dicing to form the phosphor part 2 (FIG. 8(*b*)). The width of the incident face was made 2 mm, the thickness was made 1 mm, and the inclination θ of the side face with respect to the incident face was made 63.5°. The area AI of the incident face was 4 mm$^2$ and the area of the opposing face was 1 mm$^2$. The side and opposing faces of the respective phosphor parts 2 are processed surfaces by the dicing and the arithmetic surface roughness Ra of each of the side faces and opposing faces was estimated to be 10 μm.

Then, a low refractive index layer 54 composed of $Al_2O_3$ was film-formed in a thickness of 0.5 μm on the opposing face 2*b* and side faces 2*c* of the phosphor part (refer to FIG. 9). Further, a reflection layer 55 composed of an Al alloy was film-formed on the low refractive index layer 54 in a thickness of 0.5 μm (FIG. 10). After the film formation, the substrate was heated at 100° C. on a hot plate to separate the phosphor element 1 shown in FIG. 1 from the handle substrate 53, and the adhesive was washed with an organic solvent.

A heat-dissipating substrate 8 composed of oxygen-free copper and having a width of 20 mm, length of 20 mm and thickness of 2 mm. A groove is formed in a central region of the heat-dissipating substrate 8 and the phosphor element 1 was embedded in the groove to obtain the phosphor element 41 shown in FIGS. 6 and 7.

10 GaN series blue light lasers, each having an output of 3 W, were assembled into an array to obtain a light source having an output of 30 W. Laser light was irradiated from the light source onto the phosphor element to evaluate the illumination light. The results of the evaluation of the elements of the respective examples are shown in Table 1.

(Output Power of while Light)

The output power of white light (average output power) indicates an average per time of total luminous flux. Total luminous flux measurement was carried out by using an integrating sphere (spherical integrating photometer), by turning on a light source to be measured and a standard light source, in which the total luminous flux was calibrated to values, at the same position, and by comparing them with each other. The measurement was carried out by using the method prescribed in JIS C7801 in detail.

(In-Plane Distribution of Color Unevenness)

Emitted light was evaluated in the chromaticity diagram by using a luminance distribution measurement device. Then, the case where the distribution is in a range of a median x: 0.3447±0.005 and y: 0.3553±0.005 is determined to be a case without the uneven color, and the case where the distribution is not in this range is determined to be a case with the uneven color in the chromaticity diagram.

TABLE 1

| Structure of phosphor element | FIG. 1 |
|---|---|
| Width of incident face 2a | 2 mm |
| Area AI of incident face 2a | 4 mm$^2$ |
| Width of opposing face 2b | 1 mm |
| Area AR of opposing face 2b | 1 min$^2$ |
| Inclination angle of side face with respect to incident face | 63.5° |
| Output power of white light | 2500 1 m |
| Color unevenness | None |

Comparative Example 1

The phosphor element 21 having the cross section shown in FIG. 3(*b*) was produced. The production method was performed as that in Inventive Example 1. However, the low refractive index layer 23 composed of $Al_2O_3$ was not provided on the opposing face of the phosphor element and was film-formed only on the side faces plural times by sputtering. The reflection film 24 composed of an Al alloy film was then film-formed on the low refractive index layer and opposing face, respectively, in a thickness of 0.5 μm. The thus obtained element was fixed on the heat-dissipating substrate 8 as in Inventive Example 1.

The thus obtained phosphor element was subjected to evaluation of the illumination light as in Inventive Example 1. The results of the elements of the respective examples were shown in Table 2.

TABLE 2

| Structure of phosphor element | FIG. 3 (b) |
|---|---|
| Width of incident face 2a | 2 mm |
| Area AI of incident face 2a | 4 mm$^2$ |
| Width of opposing face 2b | 1 mm |
| Area AR of opposing face 2b | 1 mm$^2$ |
| Inclination angle of side face with respect to incident face | 63.5° |
| Our put power of white light | 2300 1 m |
| Color unevenness | Present |

In the case of the phosphor element of Inventive Example 1, the output of the white light was relatively high, and color unevenness was not observed. According to the phosphor element of Comparative Example 1, the output of the white light was lowered and color unevenness was observed.

Comparative Example 2

The phosphor element 26 shown in FIG. 4 was produced, according to the method described referring to FIGS. 8 to 10.

Specifically, a phosphor plate 51 was prepared having a thickness of 1 mm, a diameter of 4 inches and composed of YAG (yttrium.aluminum.garnet) polycrystal doped with Ce and added with ceramic dispersing material. Further, a sapphire wafer was prepared having a thickness of 0.3 mm and a diameter of 4 inches as the handle substrate 53. The phosphor plate 51 was bonded with the handle substrate 53 through a thermoplastic resin 52 at 100° C. and then cooled to ambient temperature to integrate them (FIG. 8(*a*)).

Then, set-back processing was performed by dicing using a blade of a thickness of 100 μm and #800. Then, the phosphor plate was rotated by 90° and then similarly subjected to set back processing by dicing to form the phosphor part 2 (FIG. 8(*b*)). The width of the incident face was made 2 mm, the thickness was made 1 mm, and the inclination θ of the side face with respect to the incident face was made 63.5°. The area AI of the incident face was 4 mm². The side faces and opposing faces of the respective phosphor parts 2 are processed surfaces by the dicing, and the arithmetic surface roughness Ra of each of the side faces and opposing faces was estimated to be 10 μm.

Then, the low refractive index layer 27 composed of $Al_2O_3$ was film-formed only on the opposing face and was not formed on the side faces of the phosphor part by sputtering. Then, the refractive index film 4 composed of an Al alloy film was film-formed on the low refractive index layer and side faces, respectively, in a thickness of 0.5 μm. After the film formation, the substrate was heated at 100° C. on a hot plate to separate the phosphor element 26 shown in FIG. 4 from the handle substrate 53, and the adhesive was washed with an organic solvent.

A heat-dissipating substrate 8 composed of oxygen-free copper and having a width of 20 mm, length of 20 mm and thickness of 2 mm. A groove was formed in a central region of the heat-dissipating substrate 8, and the phosphor element was embedded in the groove of the heat-dissipating substrate 8 as shown in FIGS. 6 and 7.

10 GaN series blue light lasers, each having an output of 3 W, were assembled into an array to obtain a light source having an output of 30 W. Laser light was irradiated from the light source onto the phosphor element to evaluate the illumination light. The results of the evaluation of the elements of the respective examples were shown in Table 3.

TABLE 3

| Structure of phosphor element | FIG. 4 |
|---|---|
| Width of incident face 2a | 2 mm |
| Area AI of incident face 2a | 4 mm² |
| Width of opposing face 2b | 1 mm |
| Area AR of opposing face 2b | 1 mm² |
| Inclination angle of side face with respect to incident face | 63.5° |
| Our put power of white light | 2100 1 m |
| Color unevenness | Present |

According to the phosphor element of the present Example 1, the optical output of the white light was relatively high, and color unevenness was not observed. According to the phosphor element of the Comparative Example 2, the output of the white light was lowered and color unevenness was observed.

Inventive Examples 2 to 6

The phosphor element 61B shown in FIG. 13 was produced according to the production method described referring to FIGS. 8 to 10.

Specifically, a phosphor plate 51 was prepared having a thickness of 1 mm, a diameter of 4 inches and composed of YAG (yttrium.aluminum.garnet) polycrystal doped with Ce and added with ceramic dispersing material. Further, a sapphire wafer was prepared having a thickness of 0.3 mm and a diameter of 4 inches as the handle substrate 53. The phosphor plate 51 was bonded with the handle substrate 53 through a thermoplastic resin 52 at 100° C. and then cooled to ambient temperature to integrate them (FIG. 8(*a*)).

Then, set-back processing was performed by dicing using a blade of a thickness of 100 μm and #800. Then, similarly, the phosphor plate was rotated by 90° and subjected to the set-back processing by dicing to form the phosphor part 62 (FIG. 8(*b*)). The width of the incident face was made 2 mm, the thickness was made 0.29 mm, and the inclination θ of the side face with respect to the incident face was made 25°, 45°, 49°, 50° or 63.5°. The area AI of the incident face was 4 mm². The side faces and opposing faces of the respective phosphor parts 62 are processed surfaces by the dicing and the arithmetic surface roughness Ra of each of the side faces and opposing faces was estimated to be 10 μm.

Then, a low refractive index layer 54 composed of $Al_2O_3$ was film-formed in a thickness of 0.5 μm on the opposing face 62b and side faces 62c of the phosphor part (refer to FIG. 9). Further, a reflection layer 55 composed of an Al alloy was film-formed on the low refractive index layer 54 in a thickness of 0.5 μm (FIG. 10). After the film formation, the substrate was heated at 100° C. on a hot plate to separate the phosphor element 61 shown in FIG. 11 from the handle substrate 53, and the adhesive was washed with an organic solvent.

A heat-dissipating substrate 8 composed of oxygen-free copper and having a width of 20 mm, length of 20 mm and thickness of 2 mm. A groove was formed in a central region of the heat-dissipating substrate 8, and the phosphor element 61 was embedded in the groove to obtain the phosphor element 61B shown in FIG. 13.

10 GaN series blue light lasers, each having an output of 3 W, were assembled into an array to obtain a light source having an output of 30 W. Laser light (spot size diameter of 1.9 mm) was irradiated from the light source onto the phosphor element to evaluate the illumination light. The results of the evaluation of the elements of the respective examples were shown in Table 4.

TABLE 4

| | Inclination angle θ of side face with respect to incident face (°) | Output power of white light ( 1 m) | Color unevenness |
|---|---|---|---|
| Inventive example 2 | 25 | 3700 | None |
| Inventive example 3 | 45 | 3500 | None |
| Inventive example 4 | 49 | 3000 | None |
| Inventive example 5 | 50 | 2800 | None |
| Inventive example 6 | 63.5 | 2500 | None |

As can be seen from the results shown in Table 4, it is proved that the output power of the white light can be improved and color unevenness can be prevented. Particularly in the case that the scattering material is dispersed in the phosphor part, even when the inclination angle θ of the side face with respect to the incident face is made as low as 49° to 25°, results were obtained beyond expectation that the output power of the white light is improved. Further, as the inclination angle is made less than 20°, the excitation light is directly reflected at the opposing face and output in an outer peripheral thin region, resulting in the color unevenness.

Even in the case that the thickness of the phosphor was made 400 μm, as the inclination angle was made as low as 49° to 25°, the output power of the white light was improved.

Comparative Example 3

The phosphor element 21 was produced having the cross section shown in FIG. 3(*b*), according to the same production method as that of Comparative Example 1. The production method was made same as that in Comparative Example 1. However, the ceramic scattering material was dispersed in the phosphor part and the inclination θ of the side face with respect to the incident face was made 45°. The thus obtained phosphor element was fixed according to the same procedure as Inventive Example 1.

Comparative Example 4

The phosphor part was produced having the cross section shown in FIG. 4 according to the procedure the same as that of Comparative Example 2. It was produced according to the same procedure as Comparative Example 2. However, the ceramic scattering material was dispersed in the phosphor part and the inclination θ of the side face with respect to the incident face was made 45°. The thus obtained phosphor element was fixed in heat-dissipating substrate 8 according to the same procedure as that of Inventive Example 1.

The evaluation of the illumination light was evaluated according to the same procedure as that of Inventive Examples 2 to 6, for the respective phosphor elements of Inventive Example 3 and Comparative Examples 3 and 4. The results of the elements of the respective examples were shown in Table 5.

TABLE 5

|  | Structure of phosphor element | Output power of White light (1 m) | Color unevenness |
| --- | --- | --- | --- |
| Inventive Example 3 | FIG. 13 | 3500 | None |
| Comparative Example 3 | FIG. 3 (b) | 2900 | Present |
| Comparative Example 4 | FIG. 4 | 2800 | Present |

According to the phosphor element of Inventive Example 3, the output power of the white light was relatively high and the color unevenness was not observed. According to the phosphor elements of Comparative Examples 3 and 4, the output power of the white light was relatively low and the color unevenness was observed.

Figure 14:
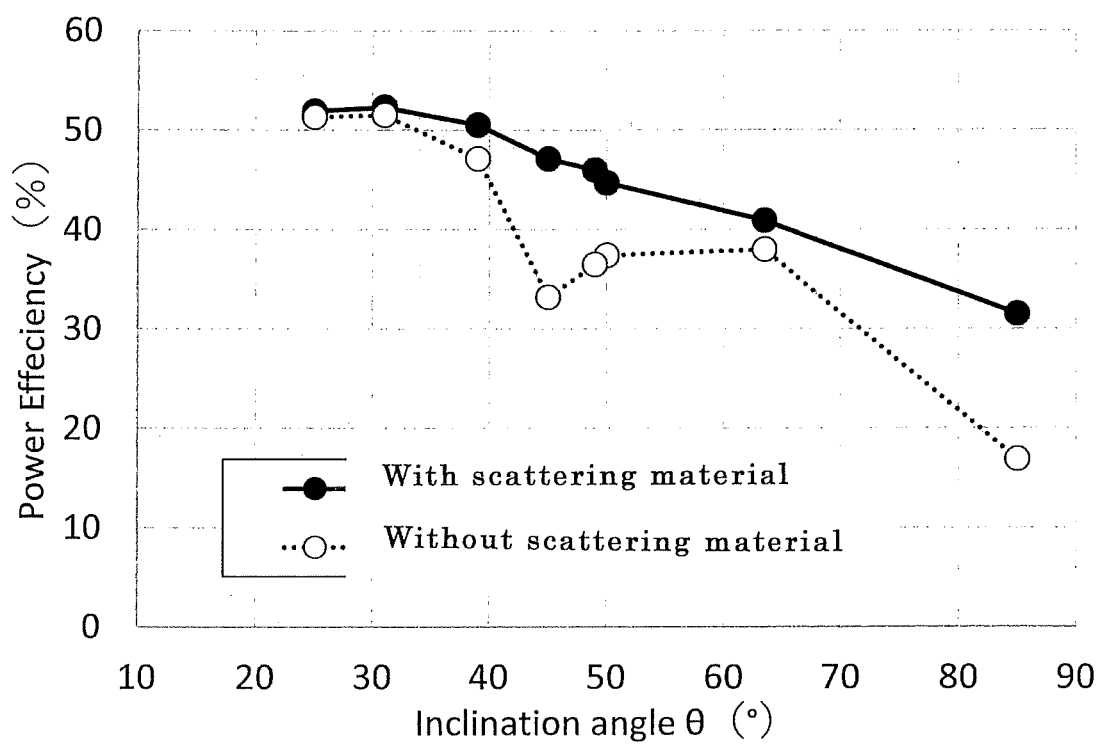
FIG. 14 is a graph showing the relationship of power efficiency and taper angle of each phosphor element.

The inclination angles θ of the side face with respect to the incident face were changed as shown in FIG. 14, in Inventive Examples 1 and 2. As described above, according to Inventive Example 1, the phosphor element shown in FIGS. 1, 6 and 7 was provided, and the scattering material was not dispersed in the phosphor part. On the other hand, according to Inventive Example 2, the phosphor element shown in FIGS. 11 and 13 was provided, and the scattering material was dispersed in the phosphor part. Further, the inclination angle θ was changed to 85°, 63.5°. 50°, 49°, 45°, 39°, 31° or 25°. The power efficiency of the thus obtained white light was shown in FIG. 14.

As a result, in the case that the scattering material is dispersed in the phosphor part, it is proved that the power efficiency (power of fluorescence power of excitation light) is particularly high when the inclination angle θ is 25° or higher and 49° or lower.

On the other hand, in the case that the scattering material is not contained in the phosphor part, it is proved that the power efficiency was particularly high when the inclination angle is 25° or more and 70° or less. More preferably, the power efficiency is high, in the case that the inclination angle θ of the side face with respect to the incident face is 25° or more and 42° or less or 49° or more and 65° or less.

The invention claimed is:

1. A method of producing a phosphor element comprising:
    a phosphor part comprising an incident face of an excitation light, an opposing face opposing said incident face and a side face, said phosphor part converting at least a part of said excitation light incident onto said incident face into a fluorescence and emitting said fluorescence from said incident face,
    an integral low refractive index layer, composed of a single material without a break, on said side face and said opposing face of said phosphor part, said low refractive index layer having a refractive index lower than a refractive index of said phosphor part; and
    an integral reflection film composed of a single material without a break and covering said phosphor part,
    wherein an area of said incident face of said phosphor part is larger than an area of said opposing face,
    said method comprising the steps of:
    bonding a phosphor substrate having a first main face and a second main face to a handle substrate at said second main face;
    processing said first main face of said phosphor substrate to form said opposing face and said side face so that said phosphor part is formed;
    film-forming said low refractive index layer on said side face and said opposing face of said phosphor part;
    film-forming said reflection film to cover a surface of said low refractive index layer; and
    separating said phosphor part from said handle substrate.

2. The method of claim 1, wherein an inclination angle of said side face with respect to said incident face is 50° or more and 85° or less.

3. The method of claim 1,
    wherein a dispersing material is dispersed in said phosphor part,
    wherein a distance between said incident face and said opposing face is 290 μm or larger and 1.0 mm or smaller, and
    wherein an inclination angle of said side face with respect to said incident face is 25° or more and 49° or less.

4. The method of claim 1,
    wherein a dispersing material is not contained in said phosphor part,
    wherein a distance between said incident face and said opposing face is 290 μm or larger and 1.0 mm or smaller, and
    wherein an inclination angle of said side face with respect to said incident face is 25° or more and 70° or less.

5. The method of claim 1, further comprising the step of providing a supporting substrate comprising a transmitting material transmitting said excitation light and said fluorescence on said incident face.

6. The method of claim 1, further comprising the step of providing a heat dissipating substrate contacting said reflection film.

7. The method of claim 3, wherein said dispersing material comprises a ceramic dispersing material.

8. The method of claim 4, wherein an inclination angle of said side face with respect to said incident face is 25° or more and 42° or less or 49° or more and 65° or less.

9. The method of claim 6, wherein said heat dissipating substrate comprises a material having a thermal conductivity of 200 W/mK or higher.

10. The method of claim 9, wherein said heat dissipating substrate comprises a metal or ceramics having a thermal conductivity of 200 W/mK or higher and 500 W/mK or lower.

11. The method of claim 10, wherein said ceramics comprises silicon carbide or aluminum nitride.

12. The method of claim 10, wherein said metal comprises gold, silver, copper, aluminum or an alloy containing said metal.

* * * * *

UNITED STATES PATENT AND TRADEMARK OFFICE
CERTIFICATE OF CORRECTION

PATENT NO. : 11,262,046 B2
APPLICATION NO. : 17/213917
DATED : March 1, 2022
INVENTOR(S) : Jungo Kondo et al.

It is certified that error appears in the above-identified patent and that said Letters Patent is hereby corrected as shown below:

On the Title Page

Item (72):
Change "Jungo Kondo, Aichi (JP)" to ---Jungo Kondo, Miyoshi-city (JP)---
Change "Naotake Okada, Aichi (JP)" to ---Naotake Okada, Anjo-city (JP)---
Change "Yuichi Iwata, Aichi (JP)" to ---Yuichi Iwata, Nagoya-city (JP)---
Change "Keiichiro Asai, Aichi (JP)" to ---Keiichiro Asai, Nagoya-city (JP)---
Change "Yudai Uno, Aichi (JP)" to ---Yudai Uno, Nagoya-city (JP)---

Please add item (30) as follows:
---(30) Foreign Application Priority Data
September 28, 2018 (WO).............PCT/JP2018/036331---

Signed and Sealed this
Seventeenth Day of May, 2022

Katherine Kelly Vidal
*Director of the United States Patent and Trademark Office*